(12) United States Patent
Grodd

(10) Patent No.: US 6,971,080 B2
(45) Date of Patent: Nov. 29, 2005

(54) PLACEMENT BASED DESIGN CELLS INJECTION INTO AN INTEGRATED CIRCUIT DESIGN

(76) Inventor: Laurence W. Grodd, 3746 SE. Yamhill, Portland, OR (US) 97214

( * ) Notice: Subject to any disclaimer, the term of this patent is extended or adjusted under 35 U.S.C. 154(b) by 446 days.

(21) Appl. No.: 10/135,941

(22) Filed: Apr. 29, 2002

(65) Prior Publication Data

US 2002/0124232 A1 Sep. 5, 2002

Related U.S. Application Data

(63) Continuation of application No. 09/234,030, filed on Jan. 19, 1999, now Pat. No. 6,381,731.

(51) Int. Cl.⁷ .............................................. G06F 17/50
(52) U.S. Cl. ..................... 716/9; 716/2; 716/6; 716/7
(58) Field of Search ................................ 716/2, 6, 7, 9

(56) References Cited

U.S. PATENT DOCUMENTS

| | | | |
|---|---|---|---|
| 5,513,124 A | * 4/1996 | Trimberger et al. ............ 716/7 |
| 5,661,663 A | 8/1997 | Scepanovic et al. |
| 5,682,322 A | 10/1997 | Boyle et al. |
| 5,754,824 A | 5/1998 | Damiano et al. |
| 6,074,430 A | 6/2000 | Tsukiboshi |
| 6,131,182 A | 10/2000 | Beakes et al. |
| 6,145,117 A | 11/2000 | Eng |

* cited by examiner

Primary Examiner—Thuan Do

(57) ABSTRACT

An EDA tool is provided with the ability to re-express a design cell of an IC design in terms of placements of a number of newly formed intervening constituent design cells, the IC design having a number of hierarchically organized placements of design cells. The new intervening constituent design cells is formed in accordance with a number of metrics profiling placements of the original constituent design cells of the design cell. The EDA tool is also provided with the ability to determine the metrics. In one embodiment, the metrics are weights reflective of at least edge placement activities associated with row/column coordinates of the design cell. The EDA tool determines these weights associated with the row/column coordinates, and then uses the determined weights to select a subset of the row/column coordinates as cut line coordinates to logically partition the design cell into a number of regions. Finally, the EDA tool selectively groups contents of the selected design cell to form the new intervening constituent design cells based on the contents' relations to the formed regions. In one embodiment, the EDA tool is a design verification tool for use to verify the IC design prior to fabrication.

28 Claims, 6 Drawing Sheets

PLACEMENT BASED DESIGN CELLS INJECTION INTO AN INTEGRATED CIRCUIT DESIGN

This is a continuation of Application Ser. No. 09/234,030, filed Jan. 19, 1999, now issued patent 6,381,731.

BACKGROUND OF THE INVENTION

1. Field of the Invention

The present invention relates to the field of integrated circuits (IC). More specifically, the present invention relates to methods and apparatuses associated with processing an IC design.

2. Background Information

Because of the ever increasing complexity of IC designs, most modern IC designs are expressed in terms of hierarchically organized design cells. For example, an exemplary IC may be expressed in terms of a collection of placements of design cells A, B, C, . . . and various "interconnecting" geometric elements, whereas design cell A may in turn be likewise expressed as a collection of placements of design cells A1, A2, . . . , and various "interconnecting" geometric elements within cell A, design cell B expressed as a collection of placements of design cells B1, B2, . . . , and various "interconnecting" geometric elements within cell B, and so forth.

Additionally, prior to fabrication (especially those IC designs fabricated using sub-micron processes), various verification operations, including but not limited to design rule checks (such as spacing), RC analysis, and so forth, are performed to ensure the fabricated IC will function as designed. In order to verify a particular design context independent and context dependent portions of the design cell separately. The context dependent portion of the design cell is promoted upward recursively until it is a part of the context independent portion of a higher level design cell, a process known as "selective promotion".

In order to facilitate efficient performance of these operations, various design cell injection techniques are known and practiced in the art to reduce the amount of selective promotions. Design cell injection is a process by which a design cell is re-expressed in terms of a number of artificially created design cells. For example, a design cell A having placements of design cells A1, A2, A3, A4 and A5 may be re-expressed in terms of placements of artificially created design cells A10 and A11, where artificially created design cell A10 is comprised of placements of design cells A1 and A2, and artificially created design cell A11 is comprised of placements of design cells A3, A4 and A5.

More specifically, Applicant is aware of three known design cell injection techniques. They are "homogenous" injection, "overlapping" injection and "heterogeneous" injection. As will be readily apparent from the description to follow, these three prior art techniques share a common characteristic in that they are "pattern based", i.e. each of the techniques is tailored for design cells having particular inter-cell relationship characteristics.

Under homogeneous injection, an exemplary design cell Z comprised of an array placement of identical design cell A, $A_{ij}$ (i.e. different instances of design cell A), where i and j both equal 1 through 4, will be re-expressed as shown in FIG. 1. That is, adjacent instances, e.g. $A_{11}$ and $A_{12}$, $A_{13}$ and $A_{14}$, will first be combined to form instances of design cell B, $B_{11}$ and $B_{12}$. Then, instances of design cell B, $B_{11}$ and $B_{12}$ etc. will be combined to form instances of design cell C, $C_1$, $C_2$ and so forth. Eventually, design cell Z is re-expressed in terms of instances of design cell D, $D_1$ and $D_2$, where design cell D is comprised of placements of design cell C. Design cell C in turn is comprised of instances of design cell B, $B_{11}$ and $B_{12}$, $B_{21}$ and $B_{22}$, $B_{31}$ and $B_{32}$ and $B_{41}$ and $B_{42}$ respectively. The technique, i.e. homogeneous injection, is commonly applied to IC such as a memory chip.

Under overlapping injection, an exemplary design cell Z' comprised of placements of design cell A', $A'_{ij}$ (i.e. different instances of design cell A'), where i and j both equal 1 through 4, and having "superimposed" placements of design cell B', $B'_{kl}$, where k and l both equal 1 through 2, will be re-expressed as shown in FIG. 2. That is, a group of design cell placements exhibiting a particular structural pattern, e.g. $A'_{11}$, $A'_{12}$, $A'_{21}$, $A'_{22}$ and $B'_{11}$, $A'_{13}$, $A'_{14}$, $A'_{23}A'_{24}$ and $B'_{12}$, will first be combined to form instances of design cell C', $C'_{11}$ and $C'_{12}$. Then, design cell placements $C'_{11}$ and $C'_{12}$ etc. will be combined to form instances of design cell D', $D'_1$ and $D'_2$. So, design cell Z' is ultimately re-expressed in terms of instances of design cell D', $D'_1$ and $D'_2$. The technique, i.e. overlapping injection, is commonly applied to IC comprised of gate arrays.

Under heterogeneous injection, an exemplary design cell Z" comprised of a number of "standard" cells will be re-expressed with new design cells replacing a group of standard cells having a distinct structural organization, as shown in FIG. 3. For example, exemplary design cell Z" having a number of placements of design cells B", C" and D", will be re-expressed in terms of multiple placements of design cell E", where design cell E" is comprised of placements of design cells B", C" and D". The technique, i.e. heterogeneous injection, is commonly applied to IC comprised of a large number of "standard" cells. [The term "standard" cell, as understood by those skilled in the art, refers to "building block" circuitry that are frequently reused in the design of an IC. They are often supplied by EDA tool vendors.]

While these techniques have worked well for IC designs having the above enumerated inter-cell relationship characteristics, experience has shown that their contributions to improving the efficiency for verifying IC designs with a large number of "flat" design cells are limited. Thus, additional approaches to further improve the efficiency for processing such IC designs are desired.

SUMMARY OF THE INVENTION

An EDA tool is provided with the ability to re-express a design cell of an IC design in terms of placements of a number of newly formed intervening constituent design cells, the IC design having a number of hierarchically organized placements of design cells. The new intervening constituent design cells are formed in accordance with a number of metrics profiling placements of the original constituent design cells of the design cell. The EDA tool is also provided with the ability to determine the metrics.

In one embodiment, the metrics are weights reflective of at least placement activities associated with row and column coordinates of the design cell. The EDA tool first determines these weights, and then uses the determined weights to select a subset of the row/column coordinates as cut line coordinates to logically partition the design cell into a number of regions. Finally, the EDA tool selectively groups contents of the selected design cell to form the new intervening design cells based on the contents' relations to the formed regions.

In one embodiment, the EDA tool is a design verification tool for use to verify the IC design prior to fabrication.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented using terminology commonly employed by those skilled in the art to convey the substance of their work to others skilled in the art, such as row/column coordinates, cut lines, horizontal/vertical orientations, and so forth. As well understood by those skilled in the art, these terminology are merely logical in nature to facilitate explanation of the present invention. Parts of the description will also be presented in terms of operations performed by a computer system, using terms such as tables, data and the like. As well understood by those skilled in the art also, these quantities take the form of electrical, magnetic, or optical signals capable of being stored, transferred, combined, and otherwise manipulated through mechanical and electrical components of a digital system; and the term digital system includes general purpose as well as special purpose data processing machines, systems, and the like, that are standalone, adjunct or embedded.

Various operations will be described as multiple discrete steps performed in turn in a manner that is most helpful in understanding the present invention, however, the order of description should not be construed as to imply that these operations are necessarily performed in the order they are presented, or order dependent. Lastly, repeated usage of the phrase "in one embodiment" does not necessarily refer to the same embodiment, although it may.

Figure 1:
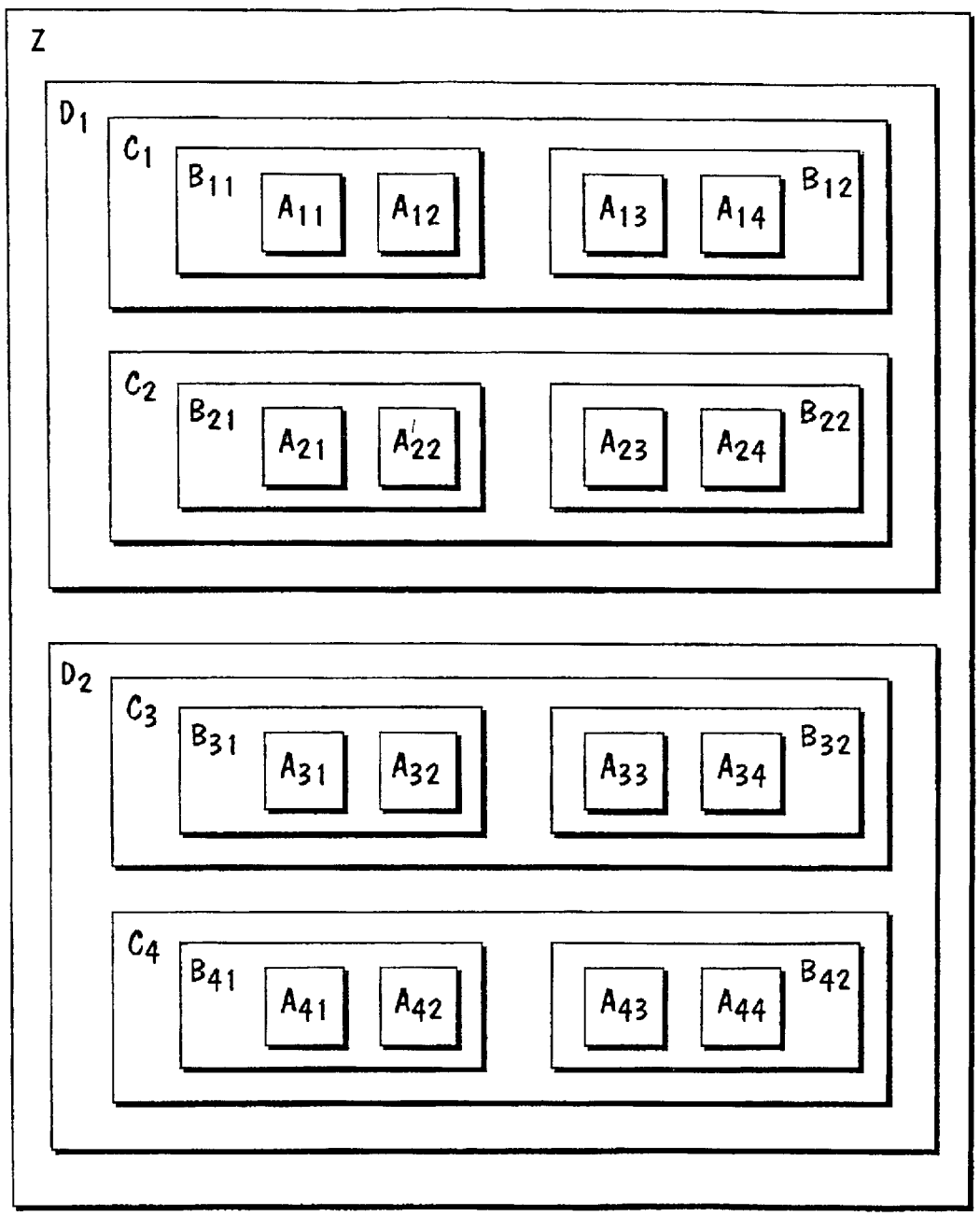
FIGS. 1–3 illustrate three known "pattern based" prior art techniques for design cells injection.
Figure 2:
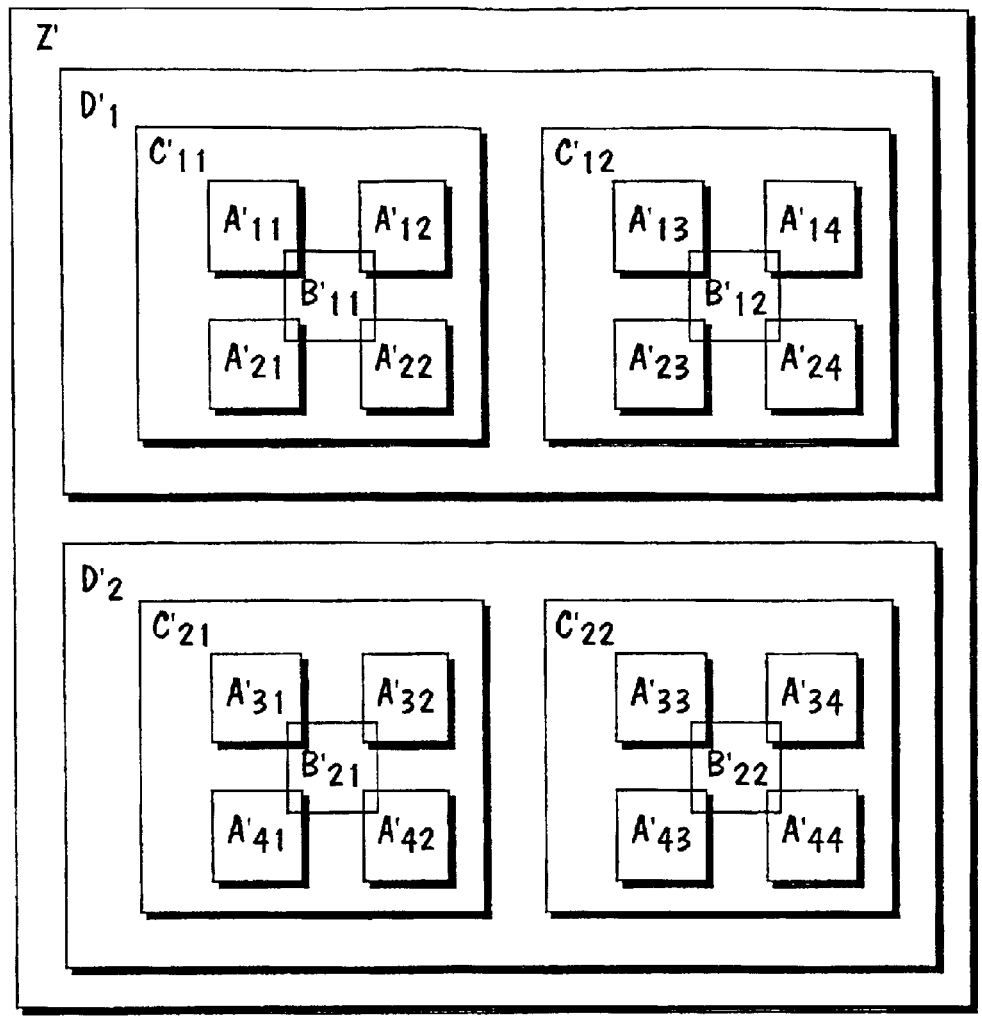
Figure 3:
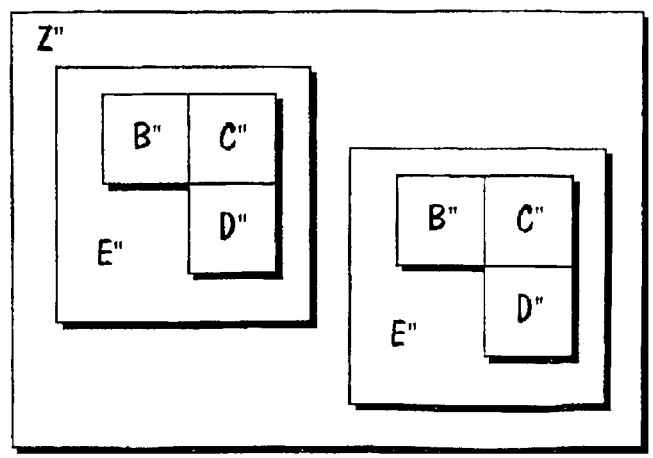
Figure 4:
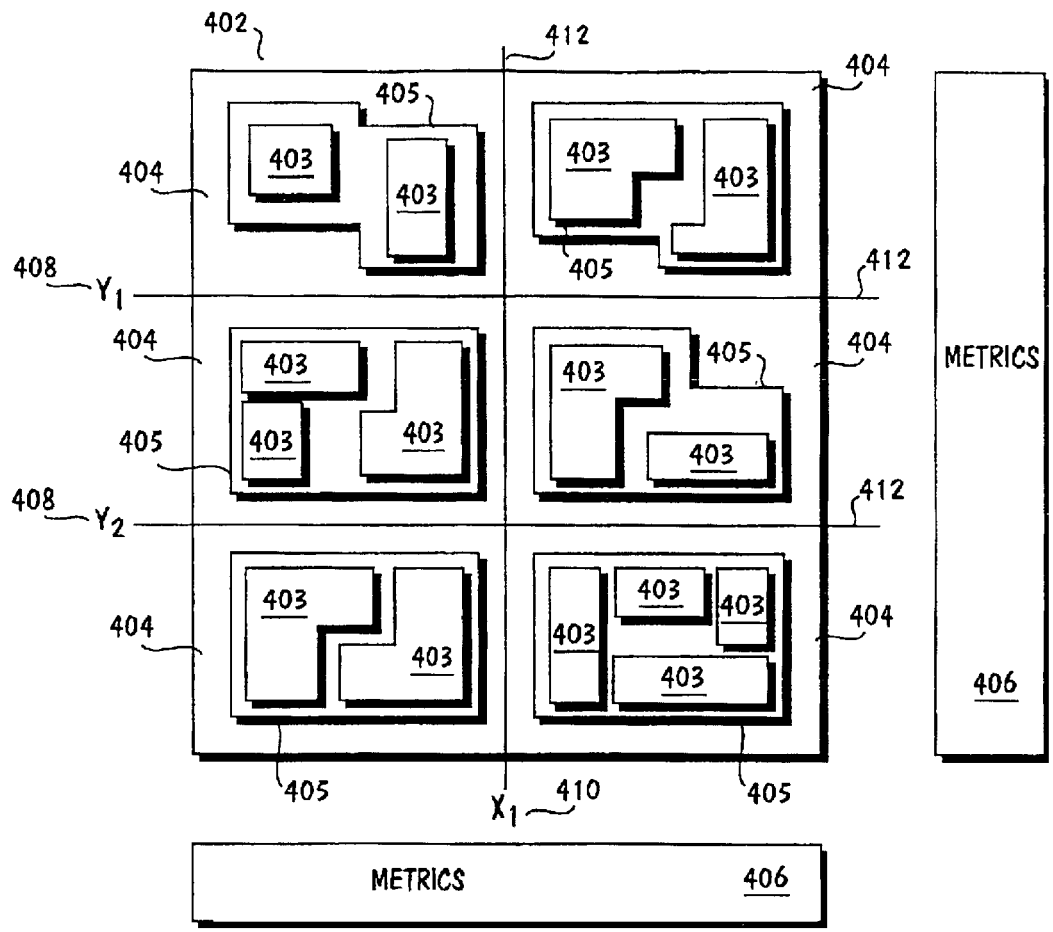
FIGS. 4–5 illustrate an overview of the "placement based" technique for design cells injection of the present invention in accordance with one embodiment.
Figure 5:
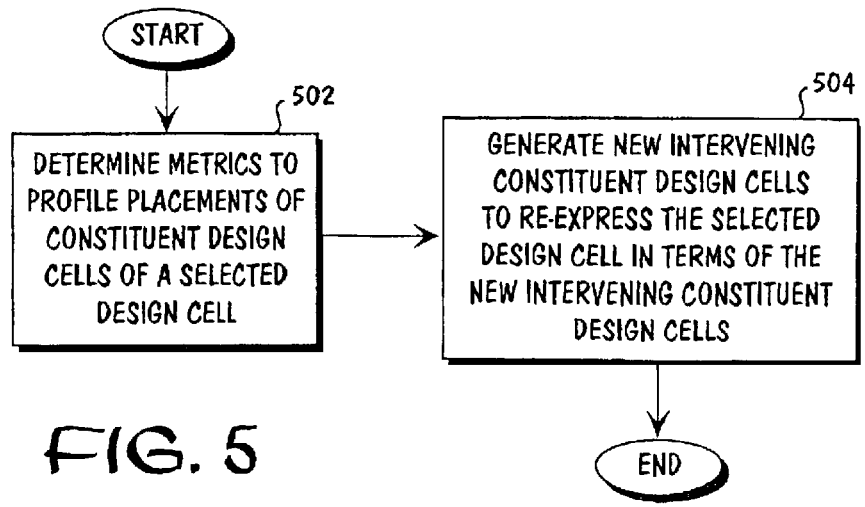

Referring now to FIGS. 4–5, wherein an overview of the "placement based" technique of the present invention is shown. As illustrated, in accordance with the present invention, design cell 402 of an integrated circuit design having a number of hierarchically organized design cells is re-expressed in terms of a number of new intervening constituent design cells 405 formed in accordance with a number of metrics 406 profiling placements of original constituent design cells 403 of design cell 402. Metrics 406 of design cell 402 are first determined (operation 502). Then, using metrics 406, contents of design cell 402 (i.e. placements and geometries) are selectively grouped to form new intervening constituent design cells 405 (operation 504), thereby allowing design cell 402 to be re-expressed in terms of the new intervening constituent design cells 405. Operations 502–504 are repeated as many times as necessary to all "applicable" design cells of the IC design. What constitutes an "applicable" design cell is application dependent. In one embodiment, the "applicable" design cells are the "flat" design cells of an IC design.

As will be described in more details below, in one embodiment, metrics 406 are weights reflective of at least placement activities at row/column coordinates, e.g. 408–410, of design cell 402. Weight metrics 406 of row and column coordinates of design cell 402 are first determined (operation 502). Then, using weight metrics 406, a subset of row/column coordinates, e.g. 408–410, are selected as cut line coordinates 408–410 to logically partition design cell 402 into a number of regions 404 with cut lines 412 (operation 504). Finally, contents of design cell 402 are selectively grouped to form new intervening constituent design cells 405 based on the contents' relations with regions 404 (operation 504).

Note that for ease of understanding, each new intervening constituent design cell 405 is shown in the illustrated embodiment as being disposed within one of regions 404, however, as will be readily apparent from the description to follow, that is not necessarily the case. A resulting intervening constituent design cell 405 may straddle multiple regions 404, to be explained more fully below. Furthermore, cut lines 412 are shown in the illustrated embodiment as "running" across the entire width/height of design cell 402, however, in alternate embodiments, the present invention may be practiced with cut lines 412 starting and stopping at any arbitrary points, as well as "running" in an angle.

Figure 6:
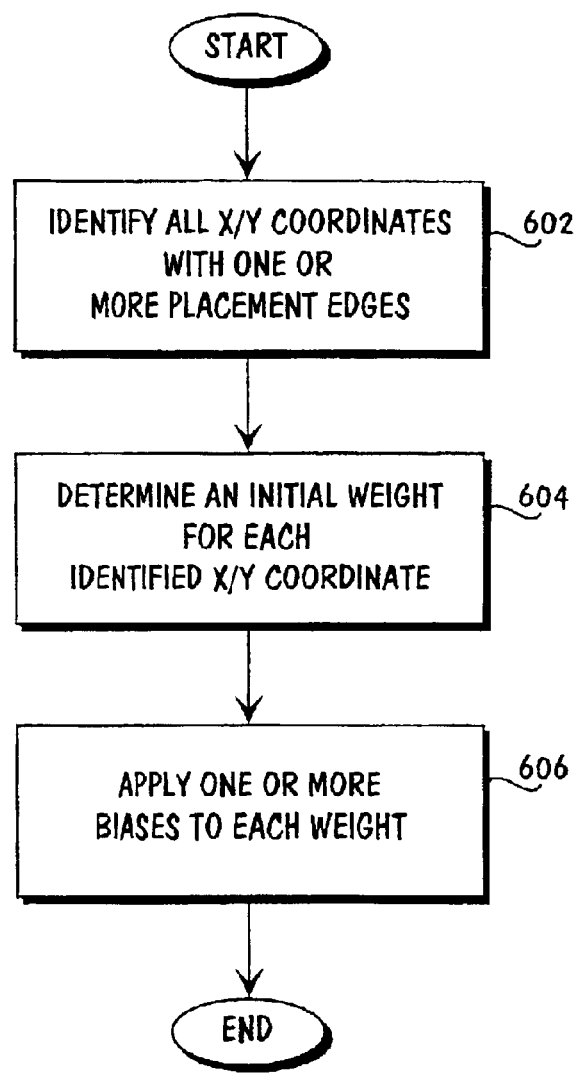
FIG. 6 illustrates determination of metrics to profile placements of constituent design cells of a selected design cell in accordance with one embodiment.

Referring now to FIG. 6 wherein determination of metrics to profile placements of constituent design cells of a selected design cell in accordance with one embodiment is shown. As illustrated, at 602, all row and column coordinates (also referred to as x and y coordinates) of the selected design cell with at least one placement activity are first identified. Then, at 604, an initial weight reflective of the placement activities is determined for each of the row/column coordinates. In one embodiment, the weight is set to equal the sum of twice the length of each placement edge along the particular row/column coordinate. Next, at 606, biases are applied to each of the initial weights. In one embodiment, the biases applied include a bias to disfavor cutting across a placement interior. In one embodiment, the bias is reflected by reducing the initially assigned weight by the sum of the lengths of all placement interiors crossing a potential cut line at the particular row/column coordinate. In one embodiment, the biases applied include a bias to facilitate substantially even distribution of the new intervening constituent design cells to be formed. In one embodiment, the bias is effectuated by proportionally adjusting each weight in view of its associated row/column coordinate's relative position in an interval, the size of which is calculated in accordance with a desired granularity level for forming the new intervening constituent design cells. More specifically, in one embodiment, the size is calculated in accordance with the formula E/(2* F), where E is the length of the appropriate (i.e. x or y) axis of the design cell and F is a granularity factor targeting the formation of F×1 or 1×F to F×F new intervening constituent design cells. For example, F may be 256 targeting the formation of 256×1 or 1×256 to 256×256 new intervening constituent design cells, or F may be 512 targeting the formation of 512×1 or 1×512 to 512×512 new intervening constituent design cells. Other granularity factors may also be used. In this embodiment, F is selected before the even distribution biasing operation is performed. In other embodiments, both biasing operations as well as other biasing operations may also be performed.

Figure 7:
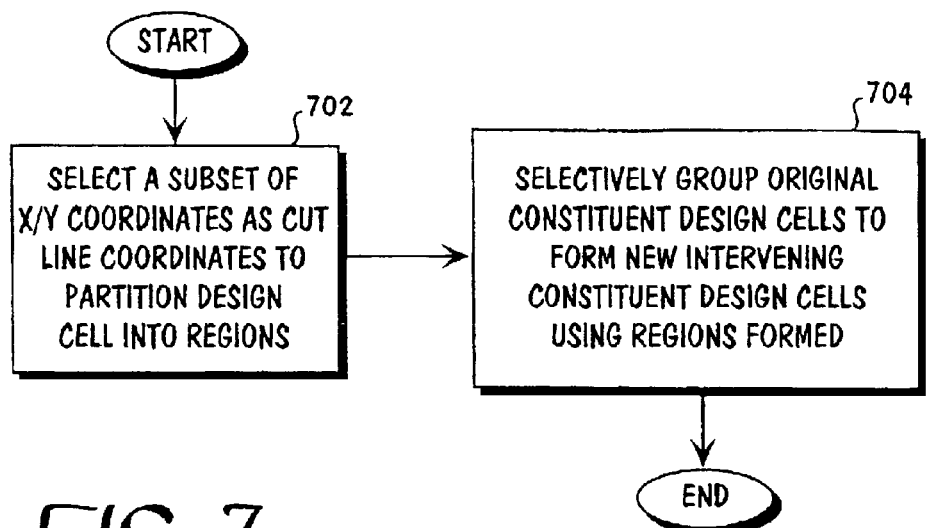
FIGS. 7–8 illustrate generation of new intervening constituent design cells using the determined metrics in accordance with one embodiment.

FIG. 7 illustrates a manner in which new intervening constituent design cells may be formed for a selected design cell using the above described coordinates associated weight metrics in accordance with one embodiment. As illustrated, at 702, a subset of the row and column coordinates are selected as cut line coordinates in accordance with at least their associated weight metrics as cut line coordinates to logically partition the selected design cell into a number of regions with cut lines logically placed at the selected row/column coordinates. Then at 704, contents of the selected design cell are selectively grouped to form the new intervening constituent design cells in accordance with the contents' relations with the formed regions. More specifically, in one embodiment, in general, one new intervening constituent design cell is formed for each region. Contents (i.e. placements and geometry) of the selected design cell disposed in a region becomes contents of a new intervening constituent design cell corresponding to the region. An original constituent design cell is "distributed" to the new intervening constituent design cell corresponding to the region to which the original constituent design cell has the most "area" affinity.

Figure 8:
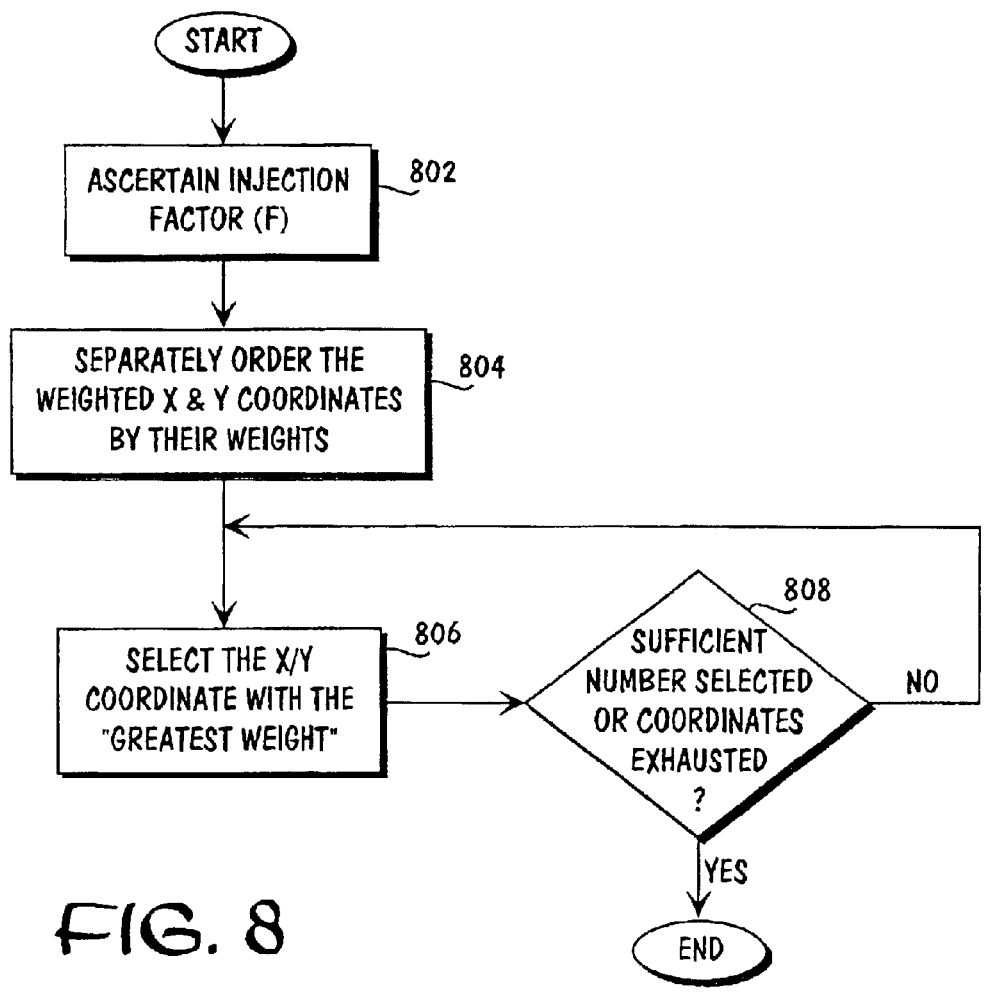

FIG. 8 illustrates a manner in which the cut line coordinates are selected in accordance with one embodiment. As illustrated, at 802, the above described granularity factor (F) is "ascertained". At 804, the row and column coordinates are separately ordered by their weights in descending order, i.e. with the coordinates having the greatest weight being placed at the "front" of the lists, or at the "top" of the queues, depending on the types of data structures employed. Next, at 806, the "top" row and column coordinates with the greatest weight are compared, and the coordinate with the "greater" weight is selected as a cut line coordinate. However, in one embodiment, a bias is further applied in the selection process. A column coordinate is favored over a row coordinate. A row coordinate is deemed to be having a greater weight than the column coordinate merely when the row coordinate's corresponding weight is at least twice that of the column coordinate's corresponding weight. The operation at 806 is repeated until either all row/column coordinates have been "exhausted" or "sufficient" number of cut line coordinates have been selected to achieve the desired granularity. In one embodiment, "sufficiency" is assumed when either the total number of cut line coordinates selected exceeds 2×F or the number of row coordinates selected times the number column coordinates selected exceeds F×F.

Figure 9:
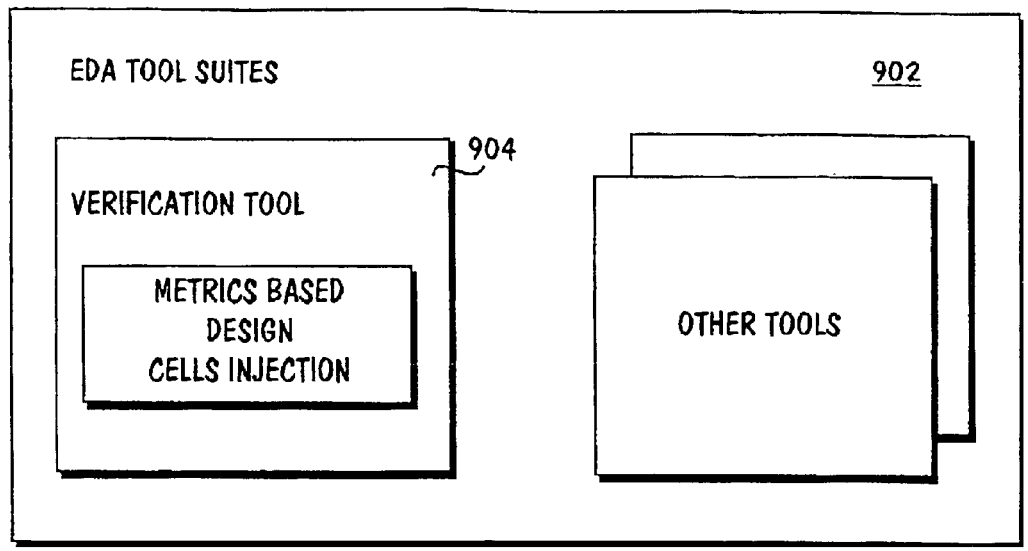
FIG. 9 illustrates an EDA tool suite incorporated with the teachings of the present invention in accordance with one embodiment.

Referring now to FIG. 9, wherein an EDA tool suite incorporated with the teaching of the present invention is shown. As illustrated, EDA tool suite 902 includes a number of tools, in particular, verification tool 904. For the illustrated embodiment, verification tool 904 is incorporated with the teachings of the present invention, i.e. it is provided with the ability to determine a number of metrics to profile placements of the constituent design cells of a design cell, and the ability to selectively group the original constituent design cells to form new intervening constituent design cells, using the determined metrics, to re-express the design cell in terms of the new intervening constituent design cells.

Figure 10:
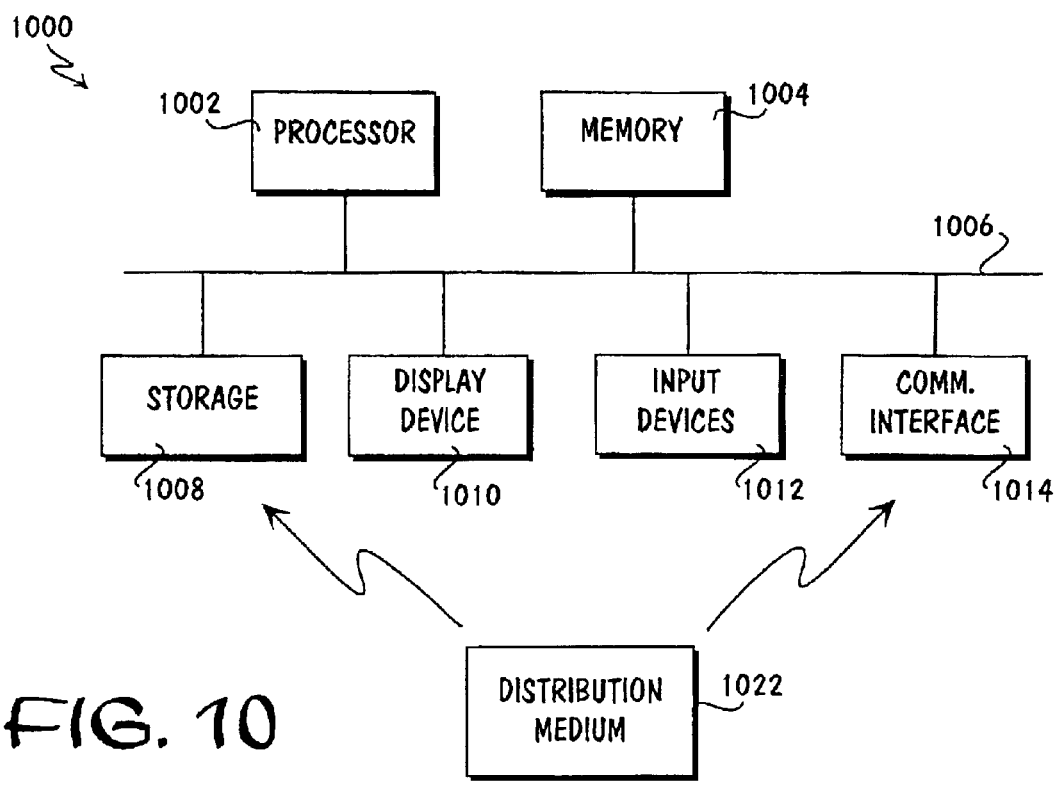
FIG. 10 illustrates a computer system suitable for practicing the present invention.

FIG. 10 illustrates one embodiment of a computer system suitable for use to practice the present invention. As shown, computer system 1000 includes processor 1002 and system memory 1004 coupled to each other via system bus 1006. Coupled also to system bus 1006 are non-volatile storage 1008, display device 1010, input/output devices 1012, and communication interface 1014. Each of these elements performs its conventional functions known in the art. In particular, system memory 1004 and non-volatile storage 1008 are employed to store a working copy and a permanent copy of the programming instructions implementing the above described teachings of the present invention. System memory 1004 and non-volatile storage 1008 may also be employed to store the IC design. The permanent copy of the programming instructions to practice the present invention may be loaded into non-volatile storage 1008 in the factory, or in the field, through distribution medium 1022 or through communication interface 1014. Any one of a number of recordable medium, such as tapes, CDROM, DVD, and so forth may be employed to store the programming instructions for distribution. In one embodiment, the programming instructions are part of a collection of programming instructions implementing EDA tool 902 of FIG. 9. The constitution of elements 1002–1022 are well known, and accordingly will not be further described. In alternate embodiments, other elements in lieu of or in addition to the elements of the illustrated embodiment, such as additional processors, may be employed.

Thus, a method and apparatus for placement based design cells injection into an IC design has been described. While the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. A method comprising:
   determining a plurality of cut lines through a design cell of an integrated circuit design based on a plurality of metrics, wherein
      said plurality of metrics are based on placement locations,
      said design cell comprises a plurality of placements of constituent design cells,
      said plurality of placements lacks regular inter-cell relationships, and
      each of said plurality of cut lines passes at least partially through the plurality of placements; and
   defining a plurality of intervening constituent design cells using the plurality of cut lines, said plurality of intervening constituent design cells re-expressing the constituent design cells.

2. The method of claim 1 wherein a particular cut line connects a first edge of the design cell to a second edge of the design cell.

3. The method of claim 1 wherein a particular cut line comprises one of a horizontal cut line and a vertical cut line.

4. The method of claim 1 wherein determining the plurality of cut lines comprises:
   identifying a plurality of coordinate sets for potential cut lines through the design cell;

associating a weight with each coordinate set, said plurality of metrics comprising the weights for each coordinate set; and selecting the plurality of cut lines from the potential cut lines based on the weights.

5. The method of claim 4 wherein associating the weight with each coordinate set comprises:

determining a number of edges of said plurality of placements along each potential cut line; and assigning a weight that is proportional to a corresponding number of edges.

6. The method of claim 4 wherein associating the weight with each coordinate set comprises:

determining a number of interiors of said plurality of placements crossing each potential cut line; and negatively biasing a given weight in proportion to a corresponding number of interiors.

7. The method of claim 4 wherein associating the weight with each coordinate set comprises:

positively biasing a given weight in favor of a column coordinate set over a row coordinate set.

8. The method of claim 1 wherein the plurality of metrics comprises a target number of cut lines.

9. The method of claim 8 wherein determining the plurality of cut lines comprises:

evenly distributing the target number of cut lines over the design cell.

10. The method of claim 1 further comprising:

verifying the design cell, including an independent verification of each of the plurality of intervening constituent design cells.

11. A method comprising:

determining a plurality of cut lines through a design cell of an integrated circuit design based on a plurality of metrics, said design cell comprising a plurality of placements of constituent design cells, each of said plurality of cut lines passing at least partially through the plurality of placements; and defining a plurality of intervening constituent design cells using the plurality of cut lines, said plurality of intervening constituent design cells comprising non-repeating subsets of the constituent design cells, wherein determining the plurality of cut lines comprises identifying a plurality of coordinate sets for potential cut lines through the design cell, associating a weight with each coordinate set, said plurality of metrics comprising the weights for each coordinate set, and selecting the plurality of cut lines from the potential cut lines based on the weights, and associating the weight with each coordinate set comprises determining a number of edges of said plurality of placements along each potential cut line and assigning a weight that is proportional to a corresponding number of edges.

12. A method comprising:

determining a plurality of cut lines through a design cell of an integrated circuit design based on a plurality of metrics, said design cell comprising a plurality of placements of constituent design cells, each of said plurality of cut lines passing at least partially through the plurality of placements; and defining a plurality of intervening constituent design cells using the plurality of cut lines, said plurality of intervening constituent design cells comprising non-repeating subsets of the constituent design cells, wherein determining the plurality of cut lines comprises identifying a plurality of coordinate sets for potential cut lines through the design cell, associating a weight with each coordinate set, said plurality of metrics comprising the weights for each coordinate set, and selecting the plurality of cut lines from the potential cut lines based on the weights, and associating the weight with each coordinate set comprises determining a number of interiors of said plurality of placements crossing each potential cut line and negatively biasing a given weight in proportion to a corresponding number of interiors.

13. A method comprising:

determining a plurality of cut lines through a design cell of an integrated circuit design based on a plurality of metrics, said design cell comprising a plurality of placements of constituent design cells, each of said plurality of cut lines passing at least partially through the plurality of placements; and defining a plurality of intervening constituent design cells using the plurality of cut lines, said plurality of intervening constituent design cells comprising non-repeating subsets of the constituent design cells, wherein determining the plurality of cut lines comprises identifying a plurality of coordinate sets for potential cut lines through the design cell, associating a weight with each coordinate set, said plurality of metrics comprising the weights for each coordinate set, and selecting the plurality of cut lines from the potential cut lines based on the weights, and associating the weight with each coordinate set comprises positively biasing a given weight in favor of a column coordinate set over a row coordinate set.

14. A method comprising:

determining a plurality of cut lines through a design cell of an integrated circuit design based on a plurality of metrics, said design cell comprising a plurality of placements of constituent design cells, each of said plurality of cut lines passing at least partially through the plurality of placements; and defining a plurality of intervening constituent design cells using the plurality of cut lines, said plurality of intervening constituent design cells comprising non-repeating subsets of the constituent design cells, wherein the plurality of metrics comprises a target number of cut lines, and determining the plurality of cut lines comprises evenly distributing the target number of cut lines over the design cell.

15. A machine readable medium having stored thereon machine executable instructions, the execution of which implement a method comprising:

determining a plurality of cut lines through a design cell of an integrated circuit design based on a plurality of metrics, wherein said plurality of metrics are based on placement locations, said design cell comprises a plurality of placements of constituent design cells, said plurality of placements lacks regular inter-cell relationships, and each of said plurality of cut lines passes at least partially through the plurality of placements; and defining a plurality of intervening constituent design cells using the plurality of cut lines, said plurality of intervening constituent design cells re-expressing the constituent design cells.

16. The machine readable medium of claim 15 wherein a particular cut line connects a first edge of the design cell to a second edge of the design cell.

17. The machine readable medium of claim 15 wherein a particular cut line comprises one of a horizontal cut line and a vertical cut line.

18. The machine readable medium of claim 15 wherein determining the plurality of cut lines comprises:
   identifying a plurality of coordinate sets for potential cut lines through the design cell;
   associating a weight with each coordinate set, said plurality of metrics comprising the weights for each coordinate set; and
   selecting the plurality of cut lines from the potential cut lines based on the weights.

19. The machine readable medium of claim 18 wherein associating the weight with each coordinate set comprises:
   determining a number of edges of said plurality of placements along each potential cut line; and
   assigning a weight that is proportional to a corresponding number of edges.

20. The machine readable medium of claim 18 wherein associating the weight with each coordinate set comprises:
   determining a number of interiors of said plurality of placements crossing each potential cut line; and
   negatively biasing a given weight in proportion to a corresponding number of interiors.

21. The machine readable medium of claim 18 wherein associating the weight with each coordinate set comprises:
   positively biasing a given weight in favor of a column coordinate set over a row coordinate set.

22. The machine readable medium of claim 15 wherein the plurality of metrics comprises a target number of cut lines.

23. The machine readable medium of claim 22 wherein determining the plurality of cut lines comprises:
   evenly distributing the target number of cut lines over the design cell.

24. The machine readable medium of claim 15, the method further comprising:
   verifying the design cell, including an independent verification of each of the plurality of intervening constituent design cells.

25. A machine readable medium having stored thereon machine executable instructions, the execution of which implement a method comprising:
   determining a plurality of cut lines through a design cell of an integrated circuit design based on a plurality of metrics, said design cell comprising a plurality of placements of constituent design cells, each of said plurality of cut lines passing at least partially through the plurality of placements; and
   defining a plurality of intervening constituent design cells using the plurality of cut lines, said plurality of intervening constituent design cells comprising non-repeating subsets of the constituent design cells, wherein
      determining the plurality of cut lines comprises identifying a plurality of coordinate sets for potential cut lines through the design cell, associating a weight with each coordinate set, said plurality of metrics comprising the weights for each coordinate set, and selecting the plurality of cut lines from the potential cut lines based on the weights, and
      associating the weight with each coordinate set comprises determining a number of edges of said plurality of placements along each potential cut line and assigning a weight that is proportional to a corresponding number of edges.

26. A machine readable medium having stored thereon machine executable instructions, the execution of which implement a method comprising:
   determining a plurality of cut lines through a design cell of an integrated circuit design based on a plurality of metrics, said design cell comprising a plurality of placements of constituent design cells, each of said plurality of cut lines passing at least partially through the plurality of placements; and
   defining a plurality of intervening constituent design cells using the plurality of cut lines, said plurality of intervening constituent design cells comprising non-repeating subsets of the constituent design cells, wherein
      determining the plurality of cut lines comprises identifying a plurality of coordinate sets for potential cut lines through the design cell, associating a weight with each coordinate set, said plurality of metrics comprising the weights for each coordinate set, and selecting the plurality of cut lines from the potential cut lines based on the weights, and
      associating the weight with each coordinate set comprises determining a number of interiors of said plurality of placements crossing each potential cut line and negatively biasing a given weight in proportion to a corresponding number of interiors.

27. A machine readable medium having stored thereon machine executable instructions, the execution of which implement a method comprising:
   determining a plurality of cut lines through a design cell of an integrated circuit design based on a plurality of metrics, said design cell comprising a plurality of placements of constituent design cells, each of said plurality of cut lines passing at least partially through the plurality of placements; and
   defining a plurality of intervening constituent design cells using the plurality of cut lines, said plurality of intervening constituent design cells comprising non-repeating subsets of the constituent design cells, wherein
      determining the plurality of cut lines comprises identifying a plurality of coordinate sets for potential cut lines through the design cell, associating a weight with each coordinate set, said plurality of metrics comprising the weights for each coordinate set, and selecting the plurality of cut lines from the potential cut lines based on the weights, and
      associating the weight with each coordinate set comprises positively biasing a given weight in favor of a column coordinate set over a row coordinate set.

28. A machine readable medium having stared thereon machine executable instructions, the execution of which implement a method comprising:
   determining a plurality of cut lines through a design cell of an integrated circuit design based on a plurality of metrics, said design cell comprising a plurality of placements of constituent design cells, each of said plurality of cut lines passing at least partially through the plurality of placements; and
   defining a plurality of intervening constituent design cells using the plurality of cut lines, said plurality of intervening constituent design cells comprising non-repeating subsets of the constituent design cells, wherein the plurality of metrics comprises a target number of cut lines, and determining the plurality of cut lines comprises evenly distributing the target number of cut lines over the design cell.

* * * * *